United States Patent
Lee et al.

(10) Patent No.: US 7,285,340 B2
(45) Date of Patent: Oct. 23, 2007

(54) ORGANIC ELECTROLUMINESCENT DEVICE AND METHOD OF MANUFACTURING THE SAME

(75) Inventors: Jong-Hyuk Lee, Yongin-si (KR); Yoon-Hyeung Cho, Yongin-si (KR); Hae-Seung Lee, Seoul (KR); Won-Jong Kim, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 417 days.

(21) Appl. No.: 10/841,455

(22) Filed: May 10, 2004

(65) Prior Publication Data

US 2004/0234813 A1    Nov. 25, 2004

(30) Foreign Application Priority Data

May 20, 2003    (KR) .................... 10-2003-0031906

(51) Int. Cl.
*H01L 51/50* (2006.01)
*B05D 5/12* (2006.01)

(52) U.S. Cl. .................. 428/690; 428/332; 428/446; 428/447; 428/702; 428/917; 313/504; 313/506; 313/512; 427/66; 257/100

(58) Field of Classification Search .......... 428/690, 428/917, 702, 446, 447, 332; 313/504, 506, 313/512; 427/66; 257/100
See application file for complete search history.

(56) References Cited

U.S. PATENT DOCUMENTS

| | | | | |
|---|---|---|---|---|
| 4,753,516 A | * | 6/1988 | Doi et al. ................... | 359/609 |
| 6,074,962 A | * | 6/2000 | Sakamoto et al. .......... | 438/790 |
| 7,037,599 B2 | * | 5/2006 | Culligan et al. ............ | 428/690 |
| 2002/0105080 A1 | * | 8/2002 | Speakman .................. | 257/749 |

* cited by examiner

*Primary Examiner*—Dawn Garrett
(74) *Attorney, Agent, or Firm*—Robert E. Bushnell, Esq.

(57) ABSTRACT

An organic electroluminescent device which has a low moisture permeability and an oxygen permeability. The organic electroluminescent device includes a substrate, an organic light-emitting unit having a sequentially stacked structure of a first electrode, an organic film, and a second electrode formed on a surface of the substrate, and an organic-inorganic composite film made of a dehydrated polycondensate of a hydrolyzed product of trialkoxy metal formed on an upper surface of the second electrode of the organic light-emitting unit. The organic-inorganic composite film simplifies a manufacture process and has high visible light transmittance. Therefore, the organic-inorganic composite film can be used as an intermediate layer of a front emission type organic electroluminescent device. Also, the organic-inorganic composite film has excellent prevention function of the entry of moisture and/or oxygen. Therefore, the encapsulation of the device is ensured even when a sealing substrate is not separately used, thereby decreasing the total thickness of the device and increasing the life span of the device.

21 Claims, 1 Drawing Sheet

ORGANIC ELECTROLUMINESCENT DEVICE AND METHOD OF MANUFACTURING THE SAME

CLAIM OF PRIORITY

This application claims the priority of Korean Patent Application No. 2003-31906, filed on May 20, 2003, in the Korean Intellectual Property Office, the disclosure of which is in corporated herein by reference in its entirety.

BACKGROUND OF THE INVENTION

1. Field of the Invention

The present invention relates to an organic electroluminescent device and a method of manufacturing the same. More particularly, the present invention relates to an organic electroluminescent device with an extended life span, and a method of manufacturing the same.

2. Description of the Related Art

Organic electroluminescent devices (organic EL devices) are self emission displays that emit light by recombination of electrons and holes in a thin layer made of a fluorescent or phosphorescent organic compound when a current is applied to the thin layer. The organic EL devices have advantages such as lightweight, simple constitutional elements, easy fabrication process, superior image quality, and wide viewing angle. In addition, the organic EL devices have electrical properties suitable for portable electronic equipment such as complete creation of moving pictures, high color purity, low power consumption, and low driving voltage.

However, the organic EL devices easily deteriorate due to entry of moisture. Therefore, an encapsulation structure preventing the entry of moisture is required.

Conventionally, a metal can or a glass substrate processed into a cap with a groove is used for preventing the entry of moisture. According to this method, for moisture absorption, a desiccant of a powder type is mounted in the groove or a desiccant of a film type adheres to the groove by means of a double-sided tape. However, in the case of the former, a process is complicated and a material and process cost is high. In addition, the entire thickness increases, and a substrate intended for encapsulation is not transparent, which makes it difficult to carry out front emission. On the other hand, in the case of the latter, there is a limitation in preventing the entry of moisture, and the desiccant of a film type is easily broken in a fabrication process or in use, thereby lowering durability and reliability. Therefore, the adhesion of the desiccant using a double-sided tape is impractical in mass production.

As another example for prevention of the entry of moisture, there is a method of forming a multilayer by alternately stacking an organic thin film, and an inorganic thin film made of $SiO_2$ or $Al_2O_3$ between a cathode and an anode. However, such a stacking method increases a process cost, which is unfavorable to mass production.

SUMMARY OF THE INVENTION

It is therefore an object of the present invention to provide an improved organic electroluminescent device with better durability and reliability.

It is another object to provide an organic electroluminescent device with an extended life span by lowering moisture permeability and oxygen permeability.

It is yet another object of the present invention to provide an improved organic electroluminescent device which has a high visible light transmittance and does not necessarily require a sealing substrate.

It is further an object to provide a simplified method of manufacturing the organic electroluminescent device.

It is still further an object to provide an improved method of manufacturing the organic electroluminescent device which has a relatively low manufacturing cost.

In order to achieve the above and other objectives, the preferred embodiment of the present invention includes: a substrate; an organic light-emitting unit having a sequentially stacked structure of a first electrode, an organic film, and a second electrode formed on a surface of the substrate; and an organic-inorganic composite film made of a dehydrated polycondensate of a hydrolyzed product of trialkoxy metal formed on an upper surface of the second electrode of the organic light-emitting unit.

According to another aspect of the present invention, there is provided a method of manufacturing an organic electroluminescent device, comprising: preparing a substrate having, on a surface thereof, a sequentially stacked structure of a first electrode, an organic film, and a second electrode; and coating a composition containing trialkoxy metal and a polar solvent on an upper surface of the second electrode followed by curing, to form an organic-inorganic composite film.

BRIEF DESCRIPTION OF THE DRAWINGS

The above and other features and advantages of the present invention will become more apparent by describing in detail exemplary embodiments thereof with reference to the attached drawing in which.

DETAILED DESCRIPTION OF THE INVENTION

An organic electroluminescent device of the present invention has an organic-inorganic composite film with a compact microstructure formed on an upper surface of a second electrode of an organic light-emitting unit. The organic-inorganic composite film controls a pinhole or nano-defect pattern present in a metal deposition film used as the second electrode or in a passivation layer formed on an upper surface of the second electrode to decrease the penetrated amount of moisture or oxygen. The organic-inorganic composite film also has an encapsulation function. The organic electroluminescent device of the present invention may also include a sealing substrate on an upper surface of the organic-inorganic composite film to reinforce the encapsulation function.

Figure 1:
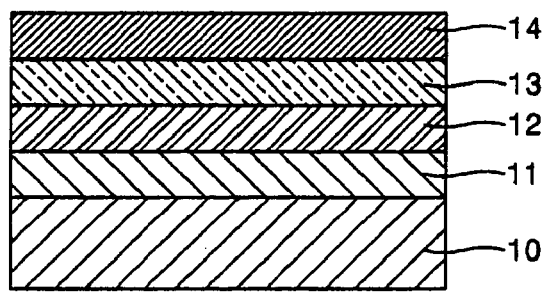
FIG. 1 is a view that illustrates an example of an organic electroluminescent device according to the present invention.

FIG. 1 shows an example of an organic electroluminescent device according to the present invention.

Referring to FIG. 1, the organic electroluminescent device has a substrate 10 and an organic light-emitting unit which has a sequentially stacked structure of a first electrode 11, an organic film 12, and a second electrode 13 on the upper surface of the substrate 10. The second electrode 13 has, on the upper surface thereof, an organic-inorganic composite film 14.

As used herein, the term, "the organic film" indicates a film made of an organic material that can be conventionally used in an organic electroluminescent device, such as a light-emitting layer, a hole transport layer, a hole injection layer, an electron transport layer, and an electron injection layer.

The organic-inorganic composite film 14 contains a dehydrated polycondensate of a hydrolyzed product of trialkoxy metal. The trialkoxy metal is represented by Formula 1 below. It is preferable to use glycidoxypropyltrimethoxysilane or methacryloxypropyltrimethoxysilane.

Formula 1 wherein $M^1$ is selected from the group consisting of silicon, titanium, tin, and zirconium, and $R_1$, $R_2$, $R_3$ and $R_4$ are independently an unsubstituted or substituted alkyl group of C1-C20 or an unsubstituted or substituted aryl group of C6-C20.

The organic-inorganic composite film 14 may further contain a dehydrated polycondensate of a hydrolyzed product of metal alkoxide represented by Formula 2 and/or a dehydrated polycondensate of a hydrolyzed product of fluoroalkylsilane represented by Formula 3. While the dehydrated condensate of the hydrolyzed product of the metal alkoxide of Formula 2 has an inorganic component for low moisture penetration, the dehydrated condensate of the hydrolyzed product of the fluoroalkylsilane represented by Formula 3 has hydrophobicity for low moisture penetration.

Formula 2 wherein $M^2$ is selected from the group consisting of silicon, titanium, tin, and zirconium, and $R_5$, $R_6$, $R_7$ and $R_8$ are independently an unsubstituted or substituted alkyl group of C1-C20 or an unsubstituted or substituted aryl group of C6-C20.

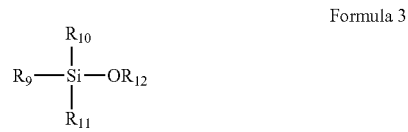

Formula 3 wherein $R_9$ is a fluorinated alkyl group of C1-C20, $R_{10}$ and $R_{11}$ are independently an alkoxy group of C1-C20 or a fluorinated alkyl group of C1-C20, and $R_{12}$ is an alkyl group of C1-C20.

Examples of the metal alkoxide represented by Formula 2 include tetraethylsilicate (TEOS), and tetramethylsilicate (TMOS). Examples of the fluoroalkylsilane represented by Formula 3 include heptadecafluorodecyltriethoxysilane, heptadecafluorodecyltrimethoxysilane, heptadecafluorodecyltriisopropoxysilane, heptadecafluorodecyltributoxysilane, di-(heptadecafluorodecyl)diethoxysilane, and tris-(heptadecafluorodecyl)ethoxysilane.

Figure 2A:
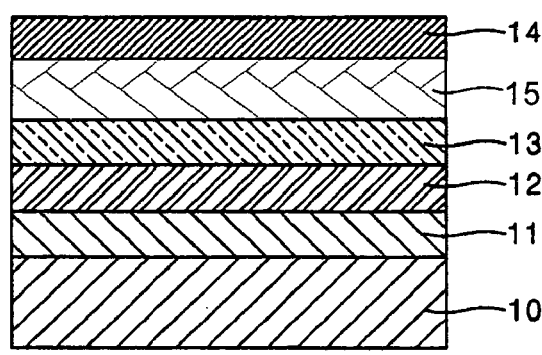
FIG. 2A and FIG. 2B show examples of an organic electroluminescent device which optionally has a passivation layer or a sealing substrate.
Figure 2B:
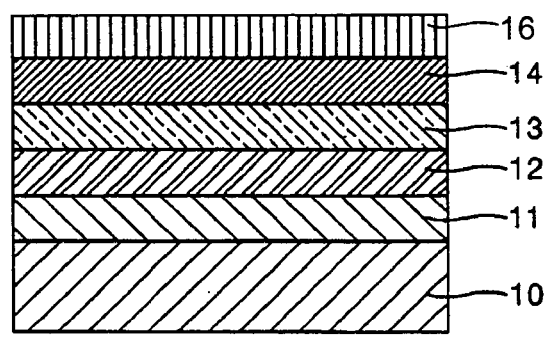

As shown in FIG. 2A, a passivation layer 15 may be further interposed between the second electrode 13 and the organic-inorganic composite film 14. Also, a sealing substrate 16 may be further formed on the upper surface of the organic-inorganic composite film 14 as shown in FIG. 2B.

The passivation layer 15, which is an inter-insulating film, is made of $SiO_2$, $Al_2O_3$, or $Si_3N_4$. The sealing substrate 16 is a glass or a transparent plastic substrate.

There are no particular limitations on the driving method of the organic electroluminescent device of the present invention. Therefore, both of passive matrix (PM) driving and active matrix (AM) driving can be used.

Hereinafter, a method of manufacturing the organic electroluminescent device of the present invention will be described.

First, a first electrode, an organic film, and a second electrode are sequentially stacked on a substrate to form an organic light-emitting unit.

On the other hand, trialkoxy metal represented by the above Formula 1 is mixed with a polar solvent to prepare a composition for formation of an organic-inorganic composite film. The composition may further contain metal alkoxide represented by the above Formula 2 and/or fluoroalkylsilane represented by the above Formula 3. When metal alkoxide of Formula 2 and/or fluoroalkylsilane of Formula 3 is/are added, it is preferable to use the metal alkoxide in an amount of 1 to 50 parts by weight and the fluoroalkylsilane in an amount of 1 to 50 parts by weight, based on 100 parts by weight of the trialkoxy metal of Formula 1.

The polar solvent is one or more selected from the group consisting of ethanol, methanol, butanol, isopropanol, methylethylketone, and pure water. The polar solvent is used in an amount of 100 to 1,000 parts by weight, based on 100 parts by weight of the trialkoxy metal of Formula 1.

The composition may further contain a catalyst for facilitating a hydrolysis reaction such as nitric acid, hydrochloric acid, phosphoric acid, and sulfuric acid. The hydrolyzable catalyst is used in an amount of 0.1 to 0.9 mole, based on 1 mole of the trialkoxy metal of Formula 1. If the content of the hydrolysable catalyst is less than 0.1 mole, a manufacture duration is prolonged. On the other hand, if it exceeds 0.9 mole, it is difficult to control a manufacture process.

The composition for the formation of the organic-inorganic composite film thus prepared is coated on the upper surface of the second electrode followed by curing to form the organic-inorganic composite film. While there are no particular limitations on a coating method, spin coating or screen printing may be used. The curing may be carried out by heat or ultraviolet light (UV). A temperature for heat curing is in a range of about 70 to about 100° C.

Preferably, the thickness of the organic-inorganic composite film is in a range of 1 to 100 μm. If the thickness of the organic-inorganic composite film is outside the range, deformation or delamination due to a stress may be caused.

In this way, the organic-inorganic composite film is easily manufactured. Also, the organic-inorganic composite film has a compact microstructure and can significantly decrease the penetrated amount of moisture and oxygen. Therefore, an organic electroluminescent device using it can have a prolonged life span. In addition, since the use of a sealing substrate may be excluded, the total thickness of the organic electroluminescent device is reduced.

Hereinafter, the present invention will be described in more detail with reference to non-limiting Examples.

EXAMPLE 1

26.00 g of TEOS28 was added to 52.32 g of ethanol and stirred for 15 minutes. 9.3 g of glycidoxypropyltrimethoxysilane (GPTS) was then added thereto and stirred for one hour. Then, a mixed catalytic solution of 11.23 g of pure water (PW) and 0.61 g of 60% nitric acid was gradually added to the resultant mixture and stirred at room temperature to prepare an organic-inorganic composite film composition.

The organic-inorganic composite film composition is spin coated on an upper surface of a cathode of an organic light-emitting unit with shaking at 300-800 rpm and then thermally cured for one hour in an oven, the temperature of which had been previously adjusted to 70° C., to thereby form an organic-inorganic composite film. Accordingly, a manufacture of an organic electroluminescent device was completed.

EXAMPLES 2-4

Organic electroluminescent devices were manufactured in the same manner as in Example 1 except that the contents of TEOS28, GPTS, PW, and nitric acid were as presented in Table 1 below.

TABLE 1

| Section | TEOS28 (g) | GPTS (g) | PW (g) | Nitric Acid | Ethanol (g) | Total Content |
|---|---|---|---|---|---|---|
| Example 1 | 26.00 | 9.38 | 11.23 | 0.61 | 52.32 | 100 |
| Example 2 | 22.53 | 13.77 | 10.93 | 0.59 | 52.17 | 100 |
| Example 3 | 19.06 | 17.70 | 10.63 | 0.58 | 52.02 | 100 |
| Example 4 | 15.60 | 21.63 | 10.33 | 0.56 | 51.87 | 100 |

EXAMPLE 5

24.92 g of TEOS28 was added to 49.65 g of ethanol and stirred for 15 minutes. 9.91 g of methacryloxypropyltrimethoxysilane (MPTMS) and 0.87 g of methacrylic acid were then added thereto and stirred for one hour. Then, a mixed catalytic solution of 10.77 of PW and 0.58 g of 60% nitric acid was gradually added to the resultant mixture and stirred at room temperature for 24 hours to thereby prepare an organic-inorganic composite film composition.

The organic-inorganic composite film composition was spin coated on an upper surface of a cathode of an organic light-emitting unit with shaking at 300-800 rpm and UV cured for 60 seconds at a 80 mW/cm² low-pressure mercuric lamp power to form an organic-inorganic composite film. Accordingly, a manufacture of an organic electroluminescent device was completed.

EXAMPLES 6-7

Organic electroluminescent devices were manufactured in the same manner as in Example 5 except that the contents of TEOS28, MPTMS, methacrylic acid, PW, nitric acid, and ethanol were as presented in Table 2.

TABLE 2

| Section | TEOS28 | MPTMS | Methacrylic | PW (g) | Nitric Acid | Ethanol (g) | Total |
|---|---|---|---|---|---|---|---|
| Example | 24.93 | 9.91 | 0.87 | 10.77 | 0.58 | 49.66 | 100 |
| Example | 10.25 | 24.82 | 2.17 | 8.94 | 0.48 | 45.08 | 100 |
| Example | 0 | 35.23 | 3.08 | 7.66 | 0.42 | 41.89 | 100 |

EXAMPLE 8

26.00 g of TEOS28 was added to 52.32 g of ethanol and stirred for 15 minutes. 9.83 g of GPTS and 1.2 g of fluoroalkylsilane (FAS) (heptadecafluorodecyltriethoxysilane) were then added thereto and stirred for one hour. Then, a mixed catalytic solution of 11.23 g of PW and 0.61 g of 60% nitric acid was gradually added to the resultant mixture and stirred at room temperature to prepare an organic-inorganic composite film composition.

The organic-inorganic composite film composition was spin coated on an upper surface of a cathode of an organic light-emitting unit with shaking at 300-800 rpm and then thermally cured for one hour in an oven, the temperature of which had been previously adjusted to 70° C., to thereby form an organic-inorganic composite film. Accordingly, a manufacture of an organic electroluminescent device was completed.

EXAMPLE 9

Organic electroluminescent devices were manufactured in the same manner as in Example 8 except that the contents of TEOS28, GPTS, FAS, PW, and nitric acid were as presented in Table 3 below.

TABLE 3

| Section | TEOS28 (g) | GPTS (g) | FAS(g) | PW (g) | Nitric | Ethanol | Total |
|---|---|---|---|---|---|---|---|
| Example 8 | 26.00 | 9.38 | 1.2 | 11.23 | 0.61 | 52.32 | 100 |
| Example 9 | 22.53 | 13.77 | 0.6 | 10.93 | 0.59 | 52.17 | 100 |

The life span characteristics of the organic electroluminescent devices manufactured in Examples 1-9 were evaluated.

According to the evaluation results, the organic electroluminescent devices of Examples 1-9 exhibited superior or similar life span characteristics, as compared to a conventional organic electroluminescent device using a common desiccant such as CaO and BaO.

An organic-inorganic composite film of the present invention simplifies a manufacture process and provides high visible light transmittance, as compared to a metal can or an alternately stacked multilayer thin film comprised of an organic material layer and an inorganic material layer for prevention of the entry of moisture. Therefore, the organic-inorganic composite film can be used as an intermediate layer of a front emission type organic electroluminescent device. Also, the organic-inorganic composite film has excellent prevention function of the entry of moisture and/or oxygen. Therefore, the encapsulation of the device is ensured even when a sealing substrate is not separately used, thereby decreasing the total thickness of the device and increasing the life span of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
   a substrate;
   an organic light-emitting unit comprising a first electrode, an organic film, and a second electrode, said organic light-emitting unit formed on the substrate; and
   an organic-inorganic composite film comprising a dehydrated polycondensate of a hydrolyzed product of a composition comprising trialkoxy metal formed on an upper surface of the second electrode of the organic light-emitting unit.

2. The organic electroluminescent device of claim 1, wherein the trialkoxy metal is represented by Formula 1:

(1)

wherein $M^1$ is selected from the group consisting of silicon, titanium, tin, and zirconium, and
   $R_1$, $R_2$, $R_3$ and $R_4$ are independently selected from the group consisting of an alkyl group of C1-C20, a substituted alkyl group of Cl-C20, an aryl group of C6-C20, and a substituted aryl group of C6-C20.

3. The organic electroluminescent device of claim 1, wherein the composition further comprises at least one selected from the group consisting of metal alkoxide represented by Formula 2 and fluoroalkylsilane represented by Formula 3:

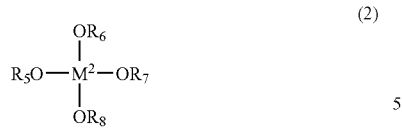

(2)

wherein $M^2$ is selected from the group consisting of silicon, titanium, tin, and zirconium, and
   $R_5$, $R_6$, $R_7$ and $R_8$ are independently selected from the group consisting of an alkyl group of C1-C20, a substituted alkyl group of C1-C20, an aryl group of C6-C20, and a substituted aryl group of C6-C20; and

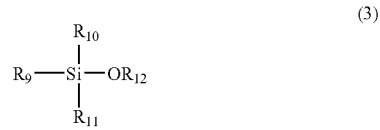

(3)

wherein $R_9$ is a fluorinated alkyl group of C1-C20, $R_{10}$ and $R_{11}$ are independently an alkoxy group of C1-C20 or a fluorinated alkyl group of C1-C20, and R12 is an alkyl group of C1-C20.

4. The organic electroluminescent device of claim 3, wherein the trialkoxy metal is selected from the group consisting of glycidoxypropyltrimethoxysilane and methacryloxypropyltrimethoxysilane.

5. The organic electroluminescent device of claim 3, wherein said metal alkoxide is selected from the group consisting of tetraethyl orthosilicate and tetramethyl orthosilicate.

6. The organic electroluminescent device of claim 3, wherein the fluoroalkylsilane is selected from the group consisting of heptadecafluorodecyltriethoxysilane, heptadecafluorodecyltrimethoxysilane, heptadecafluorodecyltriisopropoxysilane, heptadecafluorodecyltributoxysilane, di-(heptadecafluorodecyl)diethoxysilane, and tris-(heptadecafluorodecyl)ethoxysilane.

7. The organic electroluminescent device of claim 1, further comprising a passivation layer between the second electrode and the organic-inorganic composite film.

8. The organic electroluminescent device of claim 1, further comprising a sealing substrate on an upper surface of the organic-inorganic composite film.

9. The organic electroluminescent device of claim 7, wherein a thickness of the organic-inorganic composite film is in a range of 1 to 100 μm.

10. A method of manufacturing an organic electroluminescent device, comprising:
    preparing a substrate;
    preparing an organic light-emitting unit formed on the substrate, said organic-light emitting unit comprising a first electrode, an organic film, and a second electrode;
    coating a composition containing trialkoxy metal and a polar solvent on an upper surface of the second electrode; and
    curing the composition to form an organic-inorganic composite film comprising a dehydrated polycondensate of a hydrolyzed product of the composition.

11. The method of claim 10, wherein the trialkoxy metal is represented by Formula 1:

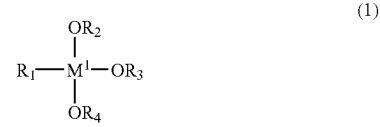

(1)

wherein $M^1$ is selected from the group consisting of silicon, titanium tin, and zirconium, and
    $R_1$, $R_2$, $R_3$ and $R_4$ are independently selected from the group consisting of an alkyl group of C1-C20, a substituted alkyl group of C1-C20, an aryl group of C6-C20, and a substituted aryl group of C6-C20.

12. The method of claim 11, wherein the trialkoxy metal is selected from the group consisting of glycidoxypropyltrimethoxysilane and methacryloxypropyltrimethoxysilane.

13. The method of claim 10, wherein the composition further comprises at least one selected from the group consisting of metal alkoxide represented by Formula 2 and fluoroalkylsilane represented by Formula 3:

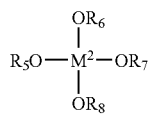
(2)

wherein $M^2$ is selected from the group consisting of silicon, titanium, tin, and zirconium, and $R_5$, $R_6$, $R_7$ and $R_8$ are independently an alkyl group of C1-C20 or an aryl group of C6-C20; and

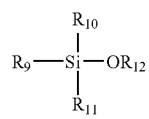
(3)

wherein $R_9$ is a fluorinated alkyl group of C1-C20, $R_{10}$ and $R_{11}$ are independently an alkoxy group of C1-C20 or a fluorinated alkyl group of C1-C20, and $R_{12}$ is an alkyl group of C1-C20.

14. The method of claim 13, wherein said metal alkoxide is selected from the group consisting of tetraethyl orthosilicate and tetramethyl orthosilicate.

15. The method 13, wherein the fluoroalkylsilane is selected from the group consisting of heptadecafluorodecyltriethoxysilane, heptadecafluorodecyltrimethoxysilane, heptadecafluorodecyltriisopropoxysilane, heptadecafluorodecyltributoxysilane, di-(heptadecafluorodecyl)diethoxysilane, and tris-(heptadecafluorodecyl)ethoxysilane.

16. The method of claim 11, wherein the composition further comprises 0.1 to 0.9 mole of a catalyst for facilitating a hydrolysis reaction based on 1 mole of the trialkoxy metal of Formula 1.

17. The method of claim 13, wherein the polar solvent is at least one selected from the group consisting of methanol, ethanol, butanol, isopropanol, and methylethylketone, and the content of the polar solvent is in a range of 100 to 1,000 parts by weight, based on 100 parts by weight of the trialkoxy metal of Formula 1.

18. The method of claim 10, further comprising forming a passivation layer on the upper surface of the second electrode prior to forming the organic-inorganic composite film.

19. The method of claim 10, further comprising forming a sealing substrate on an upper surface of the organic-inorganic composite film.

20. The organic electroluminescent device produced by the method of claim 10.

21. The organic electroluminescent device of claim 1, wherein the organic-inorganic composite film is formed directly on the upper surface of the second electrode of the organic light-emitting unit.

* * * * *